US008368065B2

(12) United States Patent
Hirakata et al.

(10) Patent No.: US 8,368,065 B2
(45) Date of Patent: Feb. 5, 2013

(54) ORGANIC THIN FILM TRANSISTOR AND METHOD OF MANUFACTURING THE SAME, AND SEMICONDUCTOR DEVICE HAVING THE ORGANIC THIN FILM TRANSISTOR

(75) Inventors: Yoshiharu Hirakata, Kanagawa (JP); Tetsuji Ishitani, Kanagawa (JP); Shuji Fukai, Kanagawa (JP); Ryota Imahayashi, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 13/160,811

(22) Filed: Jun. 15, 2011

(65) Prior Publication Data
US 2011/0240985 A1    Oct. 6, 2011

Related U.S. Application Data

(62) Division of application No. 12/605,537, filed on Oct. 26, 2009, now Pat. No. 7,985,967, and a division of application No. 10/978,399, filed on Nov. 2, 2004, now Pat. No. 7,626,196, and a division of application No. 10/628,260, filed on Jul. 29, 2003, now Pat. No. 6,821,811.

(30) Foreign Application Priority Data

Aug. 2, 2002  (JP) .................................. 2002-225772

(51) Int. Cl.
*H01L 51/30* (2006.01)
(52) U.S. Cl. .............. 257/40; 257/57; 257/642; 257/59; 257/E51.025; 438/82; 438/99; 349/43; 349/138
(58) Field of Classification Search .................. 257/22, 257/40, 200, 642, 57, E51.025, 59; 438/82, 438/99; 349/43, 138
See application file for complete search history.

(56) References Cited

U.S. PATENT DOCUMENTS

| 5,574,291 | A | 11/1996 | Dodabalapur et al. |
| 5,705,826 | A | 1/1998 | Aratani et al. |
| 5,946,551 | A | 8/1999 | Dimitrakopoulos et al. |
| 6,033,202 | A | 3/2000 | Bao et al. |
| 6,150,668 | A | 11/2000 | Bao et al. |
| 6,160,268 | A | 12/2000 | Yamazaki |
| 6,207,472 | B1 | 3/2001 | Callegari et al. |
| 6,300,988 | B1 * | 10/2001 | Ishihara et al. .................. 349/43 |

(Continued)

FOREIGN PATENT DOCUMENTS

| EP | 0 953 420 A2 | 11/1999 |
| EP | 1 263 062 | 12/2002 |

(Continued)

*Primary Examiner* — Thinh T Nguyen
(74) *Attorney, Agent, or Firm* — Nixon Peabody LLP; Jeffrey L. Costellia

(57) ABSTRACT

There have been problems in that a dedicated apparatus is needed for a conventional method of manufacturing an organic thin film transistor and in that: a little amount of an organic semiconductor film is formed with respect to a usage amount of a material; and most of the used material is discarded. Further, apparatus maintenance such as cleaning of the inside of an apparatus cup or chamber has needed to be frequently carried out in order to remove the contamination resulting from the material that is wastefully discarded. Therefore, a great cost for materials and man-hours for maintenance of apparatus have been required. In the present invention, a uniform organic semiconductor film is formed by forming an aperture between a first substrate for forming the organic semiconductor film and a second substrate used for injection with an insulating film formed at a specific spot and by injecting an organic semiconductor film material into the aperture due to capillarity to the aperture. The insulating film formed at the specific spot enables formation of the organic semiconductor film with high controllability. Further, the insulating film can also serve as a spacer that holds the aperture, that is, an interval (gap) between the substrates.

12 Claims, 15 Drawing Sheets

U.S. PATENT DOCUMENTS

| | | |
|---|---|---|
| 6,322,736 B1 | 11/2001 | Bao et al. |
| 6,326,640 B1 | 12/2001 | Shi et al. |
| 6,335,539 B1 | 1/2002 | Dimitrakopoulos et al. |
| 6,429,457 B1 | 8/2002 | Berggren et al. |
| 6,432,845 B1 | 8/2002 | Morozumi |
| 6,452,207 B1 | 9/2002 | Bao |
| 6,528,816 B1 | 3/2003 | Jackson et al. |
| 6,621,099 B2 * | 9/2003 | Ong et al. ............ 257/40 |
| 6,635,508 B2 | 10/2003 | Arai et al. |
| 6,740,900 B2 * | 5/2004 | Hirai ................. 257/40 |
| 2001/0029098 A1 | 10/2001 | Yamazaki et al. |
| 2002/0012080 A1 | 1/2002 | Ishihara et al. |
| 2002/0022299 A1 | 2/2002 | Jackson |
| 2002/0155729 A1 | 10/2002 | Baldwin et al. |
| 2002/0164835 A1 | 11/2002 | Dimitrakopoulos et al. |
| 2002/0179901 A1 | 12/2002 | Arai et al. |

FOREIGN PATENT DOCUMENTS

| | | |
|---|---|---|
| JP | 08-006041 | 1/1996 |
| JP | 08-228035 | 9/1996 |
| JP | 10-125924 | 5/1998 |
| JP | 11-330004 | 11/1999 |
| JP | 2000-29403 | 1/2000 |
| JP | 2000-269504 | 9/2000 |
| JP | 2001-244467 | 9/2001 |
| JP | 2002-359374 | 12/2002 |

* cited by examiner

ORGANIC THIN FILM TRANSISTOR AND METHOD OF MANUFACTURING THE SAME, AND SEMICONDUCTOR DEVICE HAVING THE ORGANIC THIN FILM TRANSISTOR

BACKGROUND OF THE INVENTION

1. Field of the Invention

The present invention relates to a thin film transistor having an organic semiconductor film and a manufacturing method thereof. In addition, the present invention relates to a semiconductor device provided with the above thin film transistor and a manufacturing method thereof.

2. Description of the Related Art

A display device provided with thin film transistors (TFTs) has been studied recent years. The display device provided with TFTs can be operated in low-power consumption and occupy small space compared with CRT, therefore it has been used for a display portion of a personal computer, a PDA, or the like. These TFTs have been practically manufactured using inorganic semiconductor materials such as amorphous silicon, crystalline silicon, or the like. However, there is a problem that lots of effective substrate materials can't be used since its processing temperature is above 350° C. when TFTs are manufactured using inorganic semiconductor materials.

Consequently, in addition to the inorganic materials, a thin film transistor having an organic semiconductor film formed by organic materials (hereafter referred to as an organic TFT) has been researched. Since an organic TFT can be formed at low temperature, plastic materials can be used for the substrate. As a result, a light and flexible device can be obtained. Furthermore, the organic TFT has advantages of low production cost for the sake of being formed on the inexpensive substrate materials and low voltage for driving the device.

Dipping, casting, bar coating, spin coating, spraying, ink jetting or printing is applied for the organic semiconductor film which use a polymer type (high-molecular type) organic material. (For example, Japanese Patent Laid Open No. 2000-29403, No. 2000-269504). Also, vapor deposition or the like is applied for the organic semiconductor film which use a low-molecular type organic material. (For example, Japanese Patent Laid Open No. 8-228035, No. 10-125924). In terms of improving uniformity in a film thickness, spin coating and vapor deposition are often used.

However, there have been problems that any of the above manufacturing methods requires a special apparatus, and that formed organic semiconductor films are so little to quantity consumed materials and most of the used materials are discarded in the end. Moreover, maintenance of apparatus such as cleaning of the inside of an apparatus cup or a chamber has needed to be continually performed in order to remove the contamination resulting from the material that is wastefully discarded. Therefore, a great cost for materials and man-hours for maintenance of apparatus have been required. As a result, it has not been desirable to apply these methods not only for the effect on the production cost, but also the disastrous effect on the environment generated from material wastes and liquid wastes.

It is difficult to coat the films separately by spin coating, so that patterning is required after coating the organic films allover. It is still difficult to perform patterning with absolute precision by this method. Also, there is a possibility of a thermal decomposition since temperature of sublimation is close to that of the thermal decomposition in some organic materials. In addition, ink jetting, printing and some other ways have not yet come into practical use.

Moreover, in the methods above, it is difficult to form a thin and uniform organic semiconductor film and to attain a TFT characteristic.

SUMMARY OF THE INVENTION

An object of the present invention is to provide a method of manufacturing an organic semiconductor film that does not depend on an expensive and special apparatus and which can use a material efficiently. Another object of the present invention is to provide a method of manufacturing an organic TFT which is not influenced by the pyrolysis and which can simplify the manufacturing methods that need not a patterning process.

Further, another object of the present invention is to provide a method of manufacturing an organic semiconductor film, in which a thin and uniform organic semiconductor film can be formed.

In view of the above-mentioned problems, according to the present invention, it is characterized in that an organic semiconductor film is formed by a method that utilizes a phenomenon in which a solution is sucked into an aperture (hereinafter, simply referred to as injection method). That is, according to the present invention, a solution containing an organic semiconductor film material is injected into a spot (aperture) at which the organic semiconductor film is to be formed, and a solvent is then evaporated through drying, thereby the organic semiconductor film with thinness and uniformity is formed.

Specifically, a first substrate for forming an organic semiconductor film and a second substrate used for helping injection are superimposed on each other, an aperture is formed between the substrates with an insulating film formed at a specific spot; a part (including a corner portion), typically an end (hereinafter, simply referred to as end or edge) of both the substrates is immersed in a solution containing an organic semiconductor film material; and the organic semiconductor film material is injected into the aperture due to capillarity to form the uniform organic semiconductor film. Thus, an organic TFT is completed.

Further, it may be that: a first substrate for forming an organic semiconductor film and a second substrate used for helping injection are superimposed such that ends of both the substrates are not aligned with each other (an offset structure); an aperture is formed between both the substrates with an insulating film formed at a specific spot; a solution containing an organic semiconductor film material is dropped onto the ends of the substrates; and the solution is sucked into the aperture to carry out injection of the organic semiconductor film material to thereby form the uniform organic semiconductor film. Of course, it may be that: the substrates with the offset structure are immersed in the solution containing the organic semiconductor film material; and the organic semiconductor film material is injected into the aperture due to capillarity. Note that superimposition of both the substrates in such a manner that ends thereof are not aligned with each other means superimposition of both the substrates in such a manner that at least surfaces thereof on one side are shifted from each other. On the other hand, superimposition of both the substrates in such a manner that ends thereof are aligned with each other means superimposition of both the substrates in such a manner that at least surfaces thereof on one side are aligned with each other.

The insulating film formed at the above-described specific spot enables the formation of an organic semiconductor film with high controllability. Further, as described above, the insulating film also serves as a spacer that holds the aperture between the substrates, namely, an interval (gap). Note that it is sufficient that manufacturing of an organic semiconductor film in the present invention is performed at an atmospheric pressure or under an anaerobic atmosphere. Note that the anaerobic atmosphere indicates an atmosphere in which moisture and oxygen are eliminated, and indicates, for example, an inert gas atmosphere containing nitrogen, argon, or the like. Moreover, there may be adopted an atmosphere in which an inert gas is supplied to a reduced pressure atmosphere obtained once with the purpose of removing moisture and oxygen.

According to the present invention as described above, the semiconductor film with a very thin thickness (approximately several tens to 100 Å) can be formed. Further, according to the present invention, the organic semiconductor film can be formed with efficiency, and thus, there is an expectation for simplification of the manufacturing process.

Further, according to the present invention, the organic semiconductor film can be formed only at the specific spot. Thus, apparatus maintenance and cost of cleaning solution and material can be eliminated, and therefore, total cost can be reduced. As a result, a low-cost semiconductor device provided with an organic TFT can be provided. Further, according to the present invention, there can be provided a method of manufacturing an organic semiconductor film, with which materials to be wasted and discarded are eliminated, with which liquid wastes along with apparatus maintenance and cleaning are not produced, and which is friendly to the environment.

DETAILED DESCRIPTION OF THE PREFERRED EMBODIMENTS

Embodiment Mode

Hereinafter, embodiment modes of the present invention will be described with reference to the accompanying drawings.

Embodiment Mode 1

In this embodiment mode, description will be made of a method of forming an organic semiconductor film at a predetermined portion through injection.

Figure 1A:
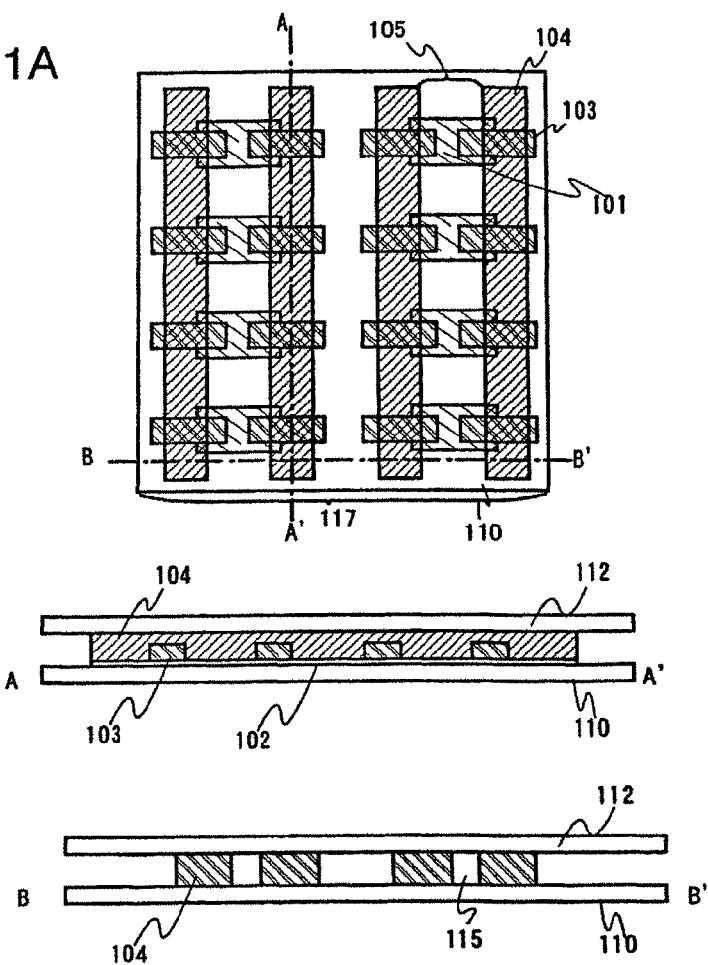
FIGS. 1A and 1B are diagrams showing a method of manufacturing an organic thin film transistor according to the present invention.

As shown in FIG. 1A, an element substrate 110 is prepared on which a gate electrode 101 formed on an insulating surface thereof, a gate insulating film 102 provided so as to cover the gate electrode (refer to a sectional view taken along the line A-A' of FIG. 1A), a source electrode and a drain electrode 103 provided so as to overlap end portions of the gate electrode through the gate insulating film, and an insulating film (hereinafter referred to as bank) 104, which is provided on the source electrode and the drain electrode and has a desired opening portion 105, are formed. Note that the opening portion includes a groove and a concave portion which are provided between adjacent banks, and is not limited in terms of shape and size, and that the opening portion may be provided over pixels or provided to each pixel. Further, a substrate (hereinafter referred to as injection auxiliary substrate) 112 which exhibits satisfactory wettability to an organic semiconductor material (hereinafter referred to as organic material) to be injected and which has a flat surface is superimposed on the element substrate 110 (refer to the sectional views of FIG. 1A). At this time, UV processing may be performed, a surface active agent or the like may be used, or application of an organic or inorganic material may be performed through spin coating or the like, with respect to the injection auxiliary substrate 112 in order to improve wettability. Note that a quartz substrate of which surface has been subjected to polishing, process and which has a thickness of 1.1 mm is used as the injection auxiliary substrate 112 in this embodiment mode.

Then, a uniform pressure is applied to the entire surface such that the injection auxiliary substrate 112 is superimposed on the element substrate 110, thereby performing fixation of both the substrates. Note that it is preferable that the element substrate 110 and the injection auxiliary substrate 112 are fixed to each other with an adhesive. The injection auxiliary substrate is superimposed on the element substrate, thereby forming an aperture 115 in which the opening portion of the bank has a long, narrow, and linear (tubular) shape (refer to the sectional view taken along the line B-B' of FIG. 1A).

Next, a solution 116 of an organic material dissolved in a solvent is prepared. As the organic material, an organic molecular crystal or an organic polymeric compound material may be used. As specific examples of the organic molecular crystal, polycylic aromatic compounds, conjugated double bond compounds, carotene, macro ring compounds, and complexes thereof, phthalocyanine, electronic transfer type complexes, and tetrathiofulvalenes: TCNQ complexes, free radicals, diphenylpicrylhydrazyl, pigments and proteins may be given. Further, as specific examples of the organic polymeric compound material, polymers such as π-conjugated polymers, CT complexes, polyvinylpyridine, iodine and phthalocyanine metal complexes may be given. Particularly, a π-conjugated polymer of which the skeleton is formed from conjugated double bond, such as polyacetylene, polyaniline, polypyrrole, polythienylene, polythiophene derivatives, poly(3-hexylthiophene) [P3HT; a polymere where the alkyl group of a polythiophene derivative with a flexible alkyl group introduced into a third position of polythiophene is a hexyl group], poly(3-alkylthiophene), poly(3-docoslthiophene), polyparaphenylene derivatives or polyparaphenylenevinylene derivatives is preferably used.

Further, as to the solvent, there may be used one in which the organic material is sufficiently dissolved and which has high wettability to the element substrate and the injection auxiliary substrate. Examples of the solvents include chloroform, toluene, xylene, tetrahydrofuran, carbon tetrachloride, benzene, dichlorobenzene, methyl ethyl ketone, and dioxane. Further, wettability may be improved by processing the surface of the element substrate or injection auxiliary substrate with a UV cleaner or the like and imparting hydrophobic property or hydrophilic property to the surface.

Note that, in this embodiment mode, the solution 116 is prepared as follows: poly(3-hexylthiophene), which is the organic material, is dissolved in 3.5 mg/ml of chloroform; and the resultant is passed through a filter with a pore size of 0.5 μm.

Figure 1B:
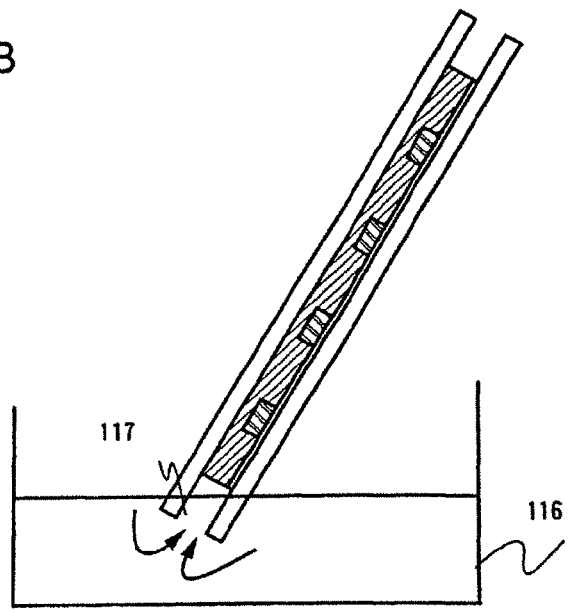

Subsequently, as shown in FIG. 1B, an injection portion 117 provided to the fixed substrates is immersed in the solution 116. Then, the organic material in the solution is injected into the aperture 115 between substrates due to capillarity.

Thereafter, the solvent is evaporated through drying, thereby being capable of forming the organic semiconductor film in the opening portion of the bank (which corresponds to the aperture in the state in which the injection auxiliary substrate is superimposed on the element substrate). Note that, since the solvent is evaporated at this time, the organic semiconductor film is coagulated and thinned. Then, the fixed injection auxiliary substrate is separated from the element substrate, and as a result, there can be obtained an organic TFT in which the organic semiconductor film with a uniform thickness is formed. Further, the solvent may be evaporated through drying after the injection auxiliary substrate is separated from the element substrate.

Note that the source electrode, drain electrode, and gate electrode and respective wirings may be connected through contact between the element substrate and the TFT. Further, the wiring layer and the insulating film may be sequentially laminated in order to secure the layer for forming the wiring. Note that, as the need arises, the insulating film may be formed of a resin material such as polyimide or acrylic to also attain leveling. Alternatively, after an oxide film, a nitride film, or the like is formed of an inorganic material, leveling property may be secured by performing chemical mechanical polishing or mechanical polishing through CMP, ELID, or the like to the formed film.

Further, the shape of the bank having the opening portion may be appropriately designed. Hereinafter, description will be made of examples of bank shapes and states of injection with reference to FIGS. 2A to 4C. Note that FIGS. 2A to 4C each show a top view of a state in which an element substrate (first substrate) and an injection auxiliary substrate (second substrate) are superimposed and fixed to each other. In addition, although ends of the first substrate and the second substrate are aligned at an injection portion in each of FIGS. 2A to 4C, a structure in which the ends are not aligned with each other (offset structure) may also be adopted.

Figure 2A:
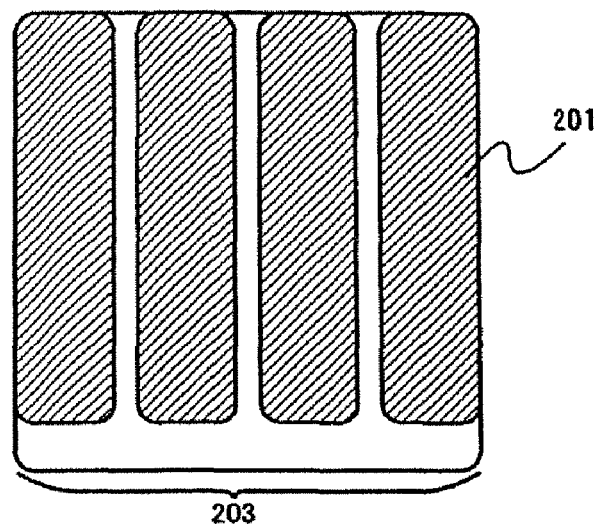
FIGS. 2A, 2B and 2C are diagrams each showing a shape of a bank and an injection process according to the present invention.

A bank 201 in FIG. 2A has a shape in which an aperture is formed only in an upper portion of a TFT, that is, a region where an organic semiconductor film is formed. The bank having such a shape provides a large contact area between the first substrate and the second substrate and easily attains pressure uniformity. Thus, injection of a solution 202 can be performed in a stable manner.

Figure 2B:
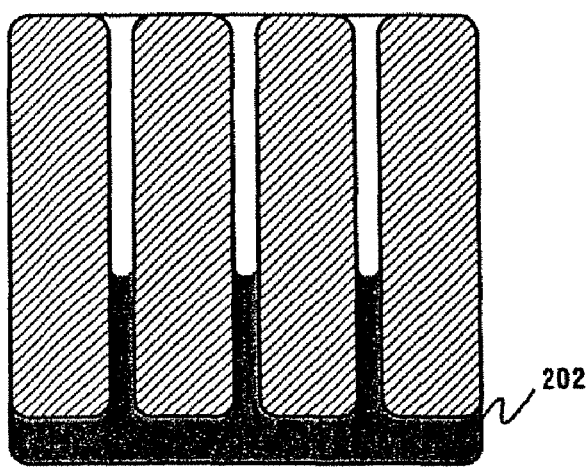
Figure 2C:
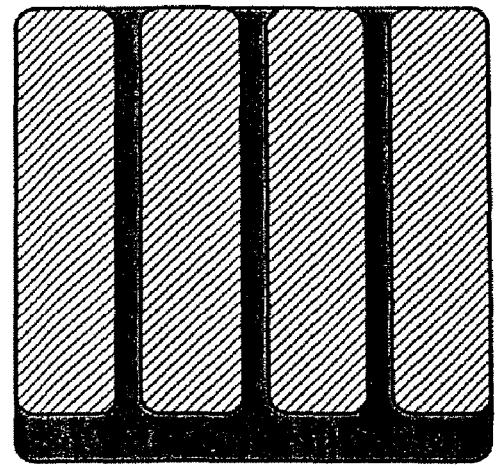

Then, as shown in FIGS. 2B and 2C, the solution 202 is injected from an injection portion 203. It is sufficient that the injection portion 203 is provided at an end of the substrates, and injection is less influenced by air and the like with the narrower injection portion. Thus, the solution can be injected uniformly. Further, the injection portion may take the offset structure for the purpose of reducing the influence of air and the like, and immersion may be carried out to such a degree that the solution 202 contacts the bank 201.

Figure 3A:
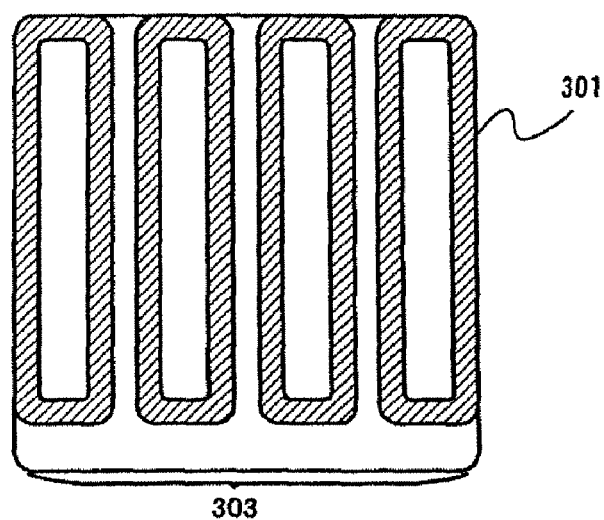
FIGS. 3A, 3B and 3C are diagrams each showing a shape of a bank and an injection process according to the present invention.
Figure 3B:
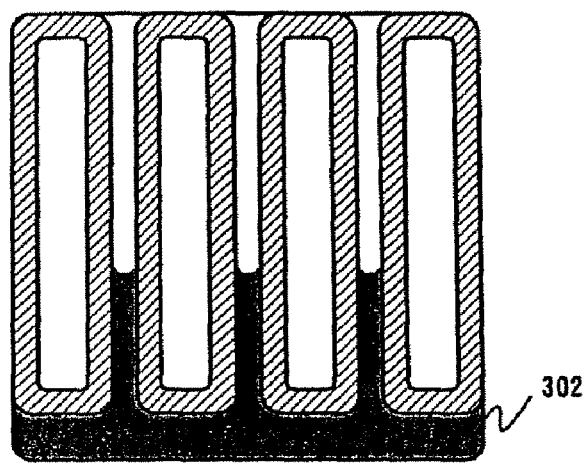
Figure 3C:
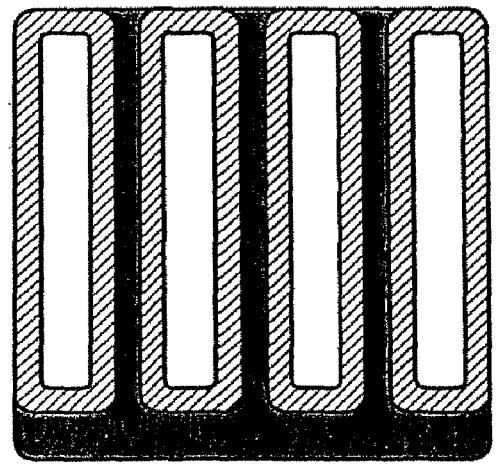

A bank 301 in FIG. 3A has a shape in which the bank is provided only at a portion necessary for injecting an organic semiconductor film into an aperture. That is, the bank 301 has a shape in which the bank 201 in FIG. 2A is provided with a space (region where a bank is not provided). The bank formed as described above is effective for preventing from deteriorating due to a capacitance formed in the upper portion and other materials Then, as shown in FIGS. 3B and 3C, a solution 302 is injected from an injection portion 303. Similarly to FIGS. 2A to 2C, it is preferable that: the injection portion is made narrow in order to avoid the influence of air and the like; and the injection portion has the offset structure to carry out immersion to such a degree that the solution 302 contacts the bank 301.

Figure 4A:
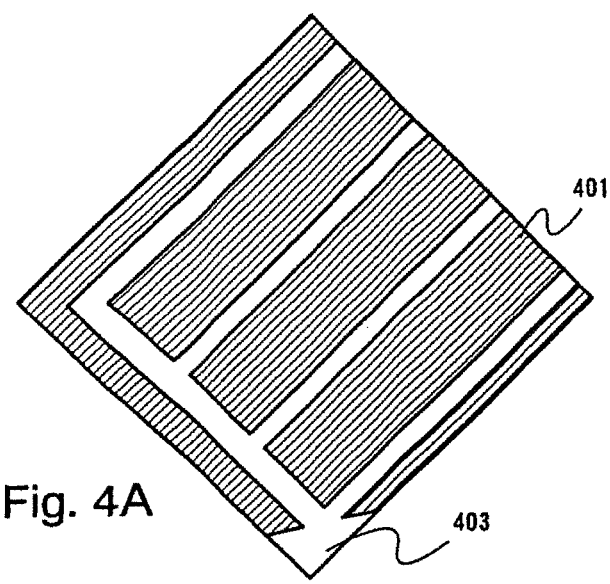
FIGS. 4A, 4B and 4C are diagrams each showing a shape of a bank and an injection process according to the present invention.
Figure 4B:
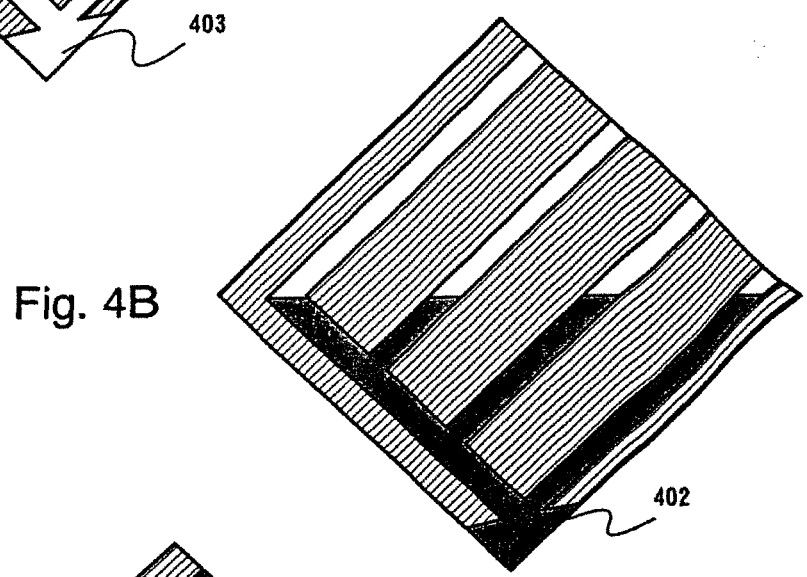
Figure 4C:
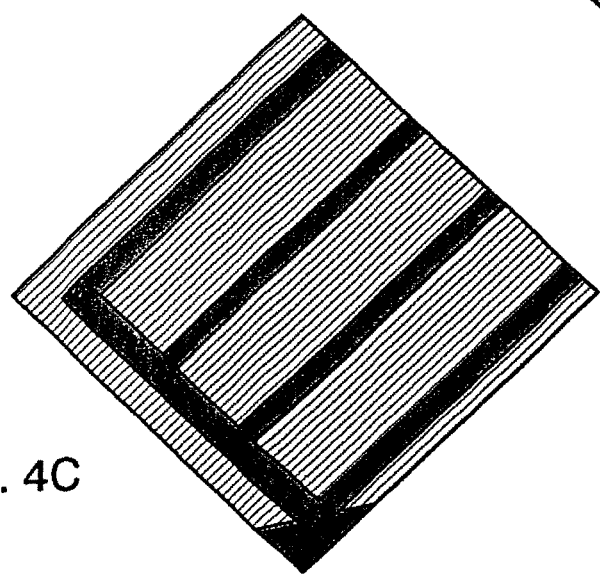

A bank 401 in FIG. 4A has a shape similar to that of the bank 201 in FIG. 2A, and corresponds to a case where an injection portion 403 is provided at a corner portion of the substrates. The bank 401 and the injection portion 403 formed as described above can reduce a contact area between the substrates and a solution 402. Therefore, possibility of contamination from the substrates to the solution can be reduced, and the influence of air and the like can be eliminated. Note that FIGS. 4B and 4C each show a state in which the solution 402 is being injected.

In order to perform injection with more uniformity, an interval (gap) between the first substrate and the second substrate and an interval (width) between banks may be controlled. For example, the gap is preferably set to several μm or less.

As described above, according to the present invention, the organic semiconductor film can be injected into the necessary portion with the insulating film formed at the specific spot and with the injection portion provided to the substrates. That is, the injection method of the present invention enables the formation of the organic semiconductor film with efficiency, and thus, material costs can be reduced. Further, according to the present invention, the organic semiconductor film can be formed at the specific spot, and thus, apparatus maintenance and cost of a cleaning solution can be eliminated.

Embodiment Mode 2

Figure 13A:
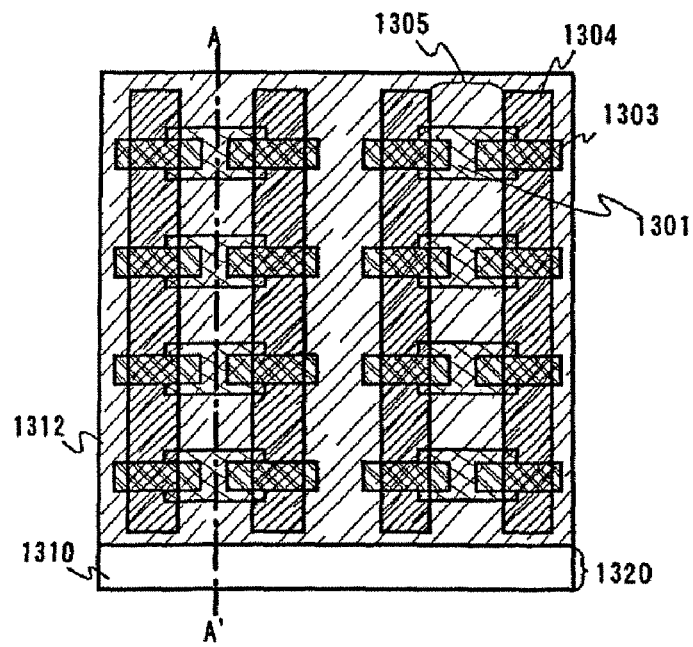
FIGS. 13A and 13B are diagrams showing a method of manufacturing an organic thin film transistor.
Figure 13B:
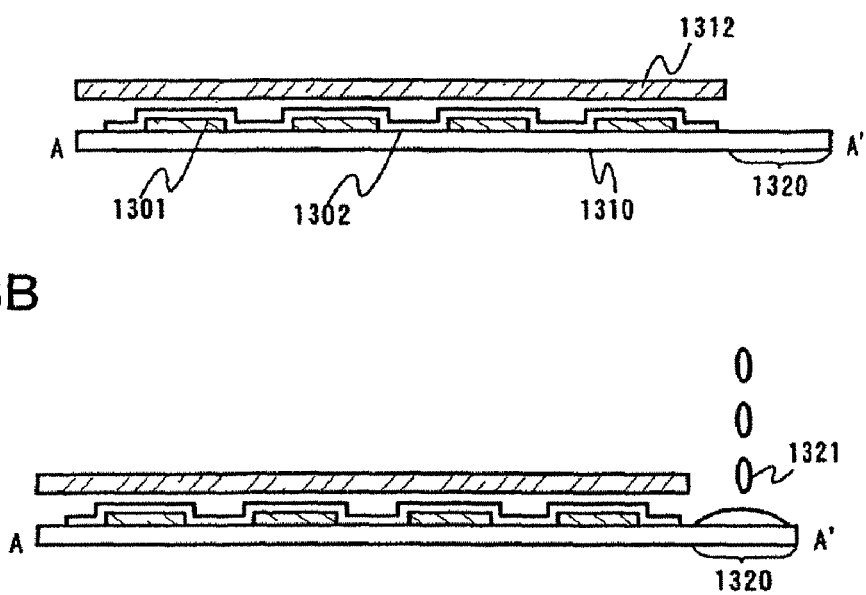

In this embodiment mode, FIGS. 13A and 13B show an example of a case where: an offset structure is taken in which a first substrate and a second substrate are superimposed such that ends thereof are not aligned with each other; and a solution containing an organic material is dropped.

First, as shown in FIG. 13A, similarly to Embodiment Mode 1, a gate electrode 1301, a gate insulating film 1302, a source electrode and a drain electrode 1303, and an insulating film 1304 that is to serve as a bank are formed on an insulating substrate 1310, and an injection auxiliary substrate 1312 is adhered to the insulating substrate 1310 to form an aperture 1305. The substrates are adhered to each other with an offset region 1320 provided in a state in which an end of the adhered insulating substrate (first substrate) 1310 is long shifted from an end of the injection auxiliary substrate (second substrate) 1312 (refer to a sectional view taken along the line A-A' of FIG. 13A). Note that, as to the adherence of the injection auxiliary substrate 1312, the insulating substrate 1310 and the injection auxiliary substrate 1312 may be fixed to each other, and are preferably adhered to each other with an adhesive or the like.

Then, as shown in FIG. 13B, a solution 1321 containing an organic material is dropped to the offset region 1320 to make the solution sucked into the aperture. Plural dropping points may be provided to the offset region 1320. Note that the solution 1321 may be synthesized by the organic material and solvent described in Embodiment Mode 1. Thereafter, the solvent is evaporated through drying, thereby being capable of forming an organic semiconductor film in an opening portion of the bank (which corresponds to the aperture in the state in which the first substrate and the second substrate are superimposed on each other). Note that, since the solvent is evaporated at this time, the organic semiconductor film is coagulated and thinned. Then, the fixed injection auxiliary substrate is separated from the element substrate, and as a result, there can be obtained an organic TFT in which the organic semiconductor film with a uniform thickness is formed.

Further, dropping is performed to each column of organic TFTs as to the second substrate, and thus, injection of the solution can be performed without failure. Moreover, the second substrate may be provided to each organic TFT. However, it is necessary that the substrate is not affected by the solution for the adjacent substrate.

As described above, the organic semiconductor film is formed by dropping the solution, whereby the organic material can be easily injected even in the case, as in a large-scale substrate, where the substrate is difficult to be tilted for injection of the solution. As a result, the uniform organic semiconductor film can be formed. Further, the organic semiconductor film can be formed with efficiency, and thus, material costs can be reduced.

Embodiment Mode 3

Figure 5A:
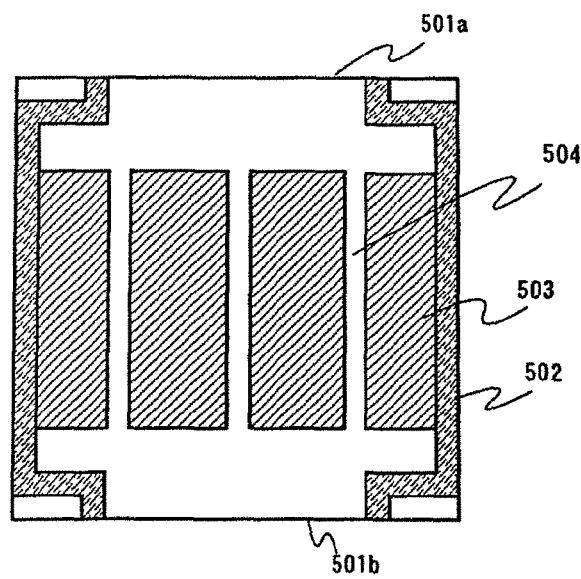
FIGS. 5A, 5B and 5C are diagrams each showing a shape of a bank and an injection process according to the present invention.
Figure 5B:
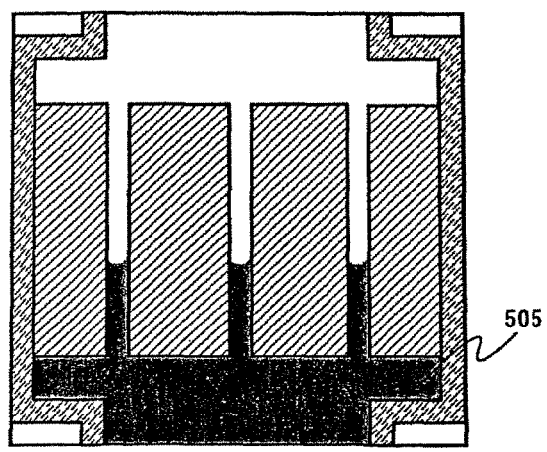

In this embodiment mode, a description will be made of a case where: when an organic semiconductor material or the like has anaerobic property, manufacturing steps of a TFT, particularly, an injection step of an organic material for forming an organic semiconductor film is performed in an anaerobic atmosphere; and sealing is performed while the above state is maintained to attain hermetic sealing, with reference to FIGS. 5A to 5C.

An element substrate (first substrate) is formed similarly to Embodiment Mode 1. Then, as shown in FIG. 5A, a seal member 502 is formed on the substrate, and a first substrate and a second substrate are fixed to each other so as to have at least two opening regions 501a and 501b where the seal member does not exist. Then, the first substrate and the second substrate are superimposed and hermetically adhered to each other through application of a uniform pressure to the entire surface by sealing member 502 while which is hardened. Note that the seal member 502 may be formed of a thermosetting epoxy resin or a UV cured resin, and a material with low permeability against moisture and oxygen is desirably used for the seal member 502. Further, when being formed of a thermosetting material, the seal member is hardened by using an oven, a hot plate, or the like. When being formed of UV cured material, the seal member is irradiated with UV light, and is further hardened through burning with the use of the oven or the hot plate if necessary.

Thus, a portion between the second substrate and a bank 503, that is, a portion (region) where the organic semiconductor film is to be formed has a long, narrow, and linear (tubular) shape, whereby an aperture 504 is formed. Then, the substrates in this state are transferred to under an anaerobic atmosphere such as an inert gas (for example, nitrogen gas) atmosphere. With one of the opening regions 501a and 501b of the adhered substrates serving as an injection portion for the organic material, injection of a solution 505 is performed from, for example, the injection portion 501b. Then, as shown in FIG. 5B, the organic material is injected into the long and narrow aperture 504 due to capillarity.

Further, in the case of suppressing influence of moisture, oxygen, and the like as much as possible, the adhered substrates are transferred to the inside of an apparatus capable of realizing high vacuum, for example, a chamber having a cryo pump. In the chamber, while high vacuum is realized and a predetermined pressure value is maintained, nitrogen with high impurity is circulated and leaked. Thereafter, when the pressure reaches an atmospheric pressure, the solution 505 may be supplied to the inside of the chamber and injected from the injection portion. Further, as described in Embodiment Mode 2, the solution may be dropped with the offset structure.

Thereafter, the solvent is evaporated to be dried through natural seasoning, baking, or the like in a state where the first substrate and the second substrate are adhered to each other. As a result, the organic semiconductor film is formed in the aperture 504 between the banks.

Figure 5C:
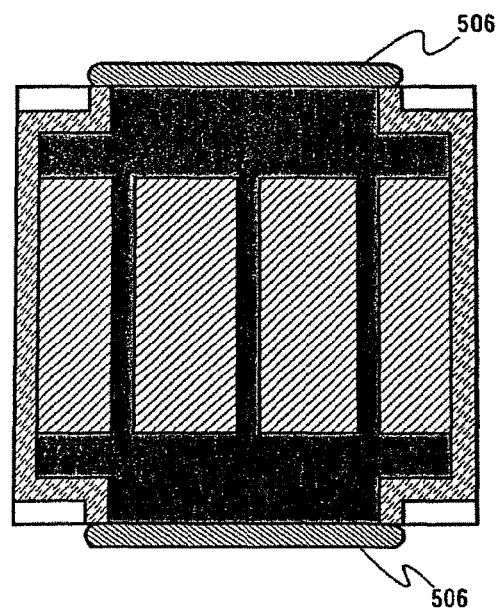

Finally, as shown in FIG. 5C, a sealing material 506 formed of a UV resin is attached to each of the opening regions 501a and 501b, and is hardened by being irradiated with UV light, thereby completing an organic TFT sandwiched by the first substrate and the second substrate. Further, the opening regions 501a and 501b are sealed in the inert gas atmosphere kept after drying, whereby an organic TFT can be formed even by using the organic material susceptible to moisture and oxygen. Moreover, it is desirable that the steps of: the formation of the bank on the first substrate; injection of the injection material; and sealing are performed in the same chamber. In addition, a space in which a sheet-like drying agent can be arranged may be provided between the first substrate and the second substrate.

The organic TFT formed as described above enables reduction of moisture and oxygen in the element to the utmost. Accordingly, longer-term reliability can be secured.

Further, the injection method of the present invention enables the formation of an organic semiconductor film with efficiency, and thus, material costs can be reduced. Furthermore, according to the present invention, an organic semiconductor film can be formed at the specific spot, and thus, apparatus maintenance and cost of a cleaning solution can be eliminated.

Embodiment Mode 4

In this embodiment mode, description will be made of an example of a case where a formation range of an organic semiconductor film is wide because of a large-scale substrate although, in the case of a substrate with a size at a certain degree, it is sufficient that an organic TFT is formed after an area of a bank is somewhat increased, with reference to FIGS. 6A to 6C.

Figure 6A:
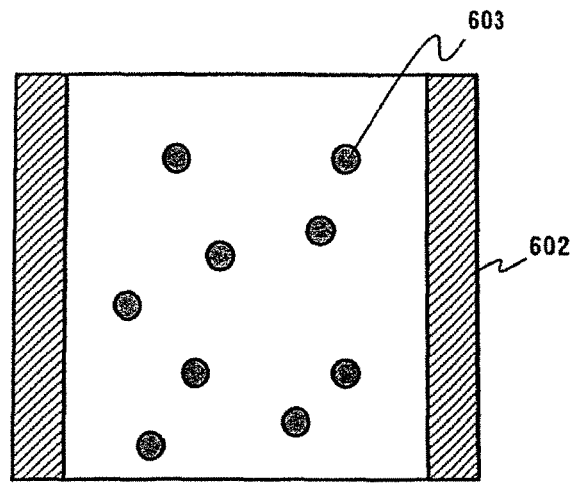
FIGS. 6A, 6B and 6C are diagrams each showing a shape of a bank and an injection process according to the present invention.

As shown in FIG. 6A, a columnar spacer 603 is formed inside a seal member, in particular, inside a bank 602 through the same step as that for forming the bank. By forming the columnar spacer 603 as described above, an interval (gap) between a first substrate and a second substrate each of which has a large size can be kept uniform, and the organic semiconductor film can be formed over a wide range.

Figure 6B:
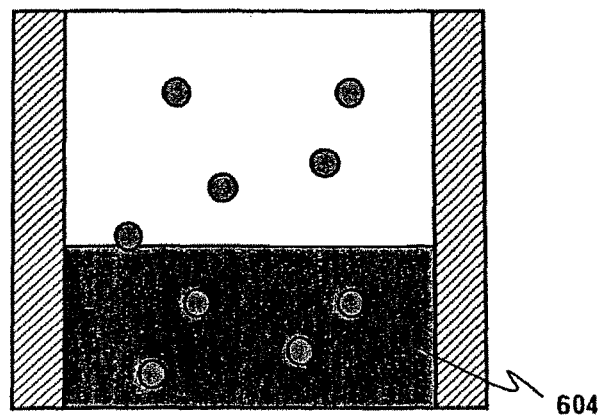
Figure 6C:
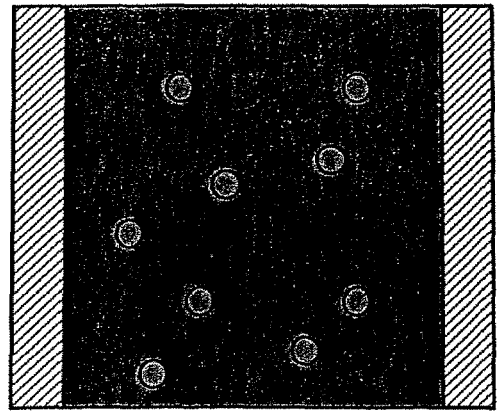

As shown in FIG. 6B, a solution 604 is prepared, and the substrates, which have been adhered so as to keep the interval (gap) uniform, are immersed in the solution 604. Then, an organic material is injected into an aperture due to capillarity. Note that FIGS. 6B and 6C each shows a state in which the solution 604 is being injected. Even in the case of the large-scale substrate and the wide formation range of the organic semiconductor film, the solution 604 can be injected with efficiency.

Further, in this embodiment mode, the arrangement of the columnar spacer is appropriately set. As a result, the formation point of the organic semiconductor film can be controlled, and also, the organic semiconductor film can be formed at random. Further, in this embodiment mode, the solution may be dropped by using the offset structure shown in Embodiment Mode 2.

The above-described injection method of the present invention enables the formation of the organic semiconductor film with efficiency also with respect to the large-scale substrate. As a result, material costs can be reduced.

Embodiment Mode 5

Figure 7A:
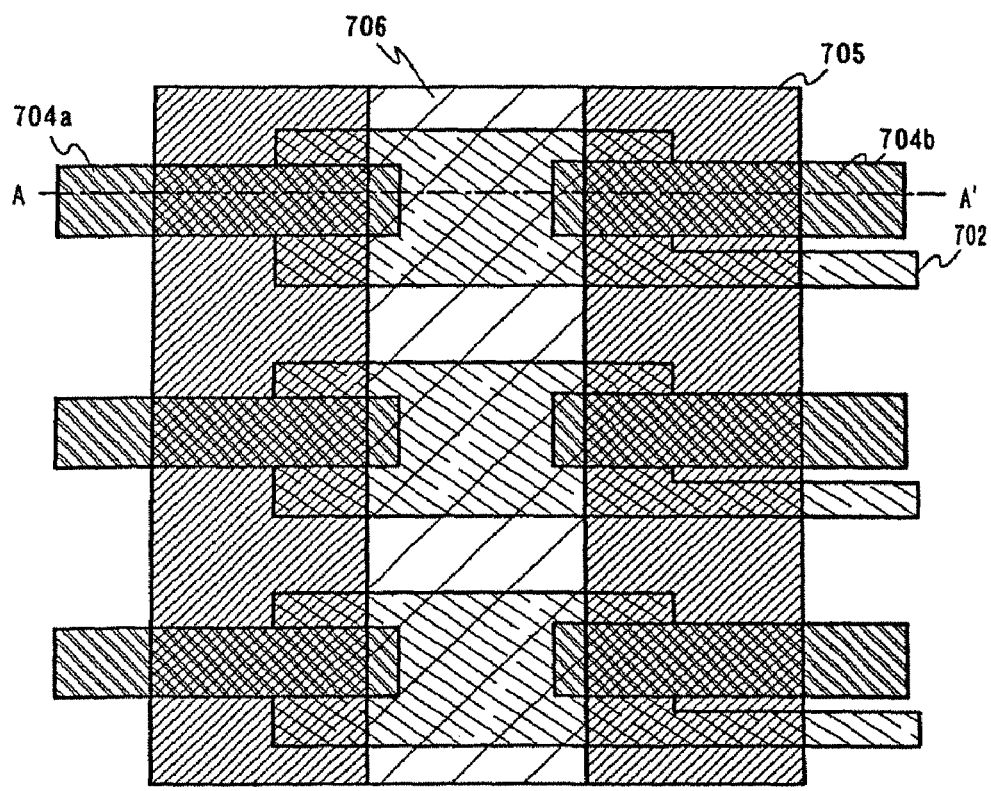
FIGS. 7A and 7B are diagrams showing a method of manufacturing an organic thin film transistor according to the present invention.
Figure 7B:
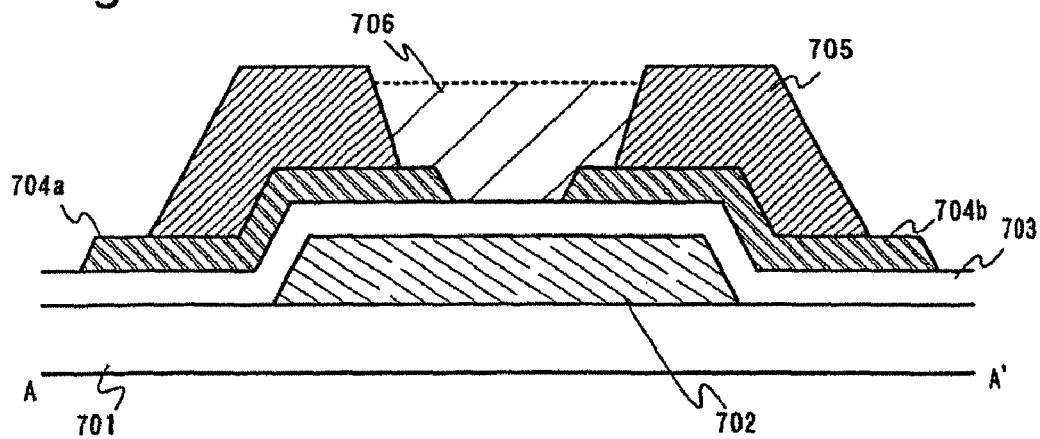

In this embodiment mode, description will be made of an example of manufacturing of an organic TFT with reference to FIGS. 7A and 7B. Note that FIG. 7A is a top view, and FIG. 7B is a sectional view taken along the line A-A' of FIG. 7A.

First, a substrate 701 having an insulating surface (hereinafter referred to as insulating substrate) is prepared. Note that it is sufficient that: the insulating substrate 701 is a substrate with heat resistance that can withstand a processing temperature; and a glass substrate, a plastic substrate, or a quartz substrate is used. Then, a first conductive film with a thickness of 100 to 200 nm is formed on the insulating substrate 701 by sputtering. Further, the first conductive film may be formed of a metal material that can function as a gate electrode, and may be specifically formed of an element selected from the group consisting of Ta, W, Ti, Mo, Al, and Cu or an alloy material or compound material containing the element as its main constituent. Thereafter, a resist is applied onto the first conductive film, baking is performed thereto, and exposure is performed thereto using a patterning mask to carry out developing. Then, the first conductive film is subjected to etching through dry etching. After etching, the resist is peeled off using a peeling solution, thereby forming a gate electrode 702. Note that the gate electrode 702 is formed using W in this embodiment mode.

Further, the gate electrode may be held in common by plural TFTs. The structure is effective for a pixel TFT in an active matrix circuit.

Further, although not shown in the figure, an insulating film may be provided between the insulating substrate 701 and the gate electrode 702. The insulating film serves as a barrier layer against water vapor or organic gas which enters from an external environment, and can prevent an organic semiconductor material or the like from deteriorating due to the water vapor or organic gas.

After the gate electrode 702 is formed, a first insulating film 703 is formed with a thickness of 100 to 200 nm. Note that the first insulating film 703 is formed of an insulating film containing silicon oxide, silicon oxynitride, or other silicon by using plasma CVD or sputtering. In this embodiment mode, the first insulating film 703 is formed of a silicon oxynitride film by using plasma CVD. Of course, the first insulating film 703 is not limited to the silicon oxynitride film, and the other insulating film containing silicon may be used in a form of a single layer or lamination layer structure. The first insulating film 703 formed as described above functions as a gate insulating film.

Next, a second conductive film with a thickness of 200 nm is formed on the gate insulating film 703 by sputtering. The second conductive film formed here needs to be connected with an organic semiconductor film through an ohmic contact. Therefore, in the case of a p-type organic semiconductor material, the second conductive film needs to be formed by using a conductive film material (metal material) having a work function larger than an ionization potential of the organic semiconductor material. On the contrary, in the case of an n-type organic semiconductor material, the second conductive film needs to be formed by using a conducive film material (metal material) having a work function smaller than an ionization potential of the organic semiconductor material. In this embodiment mode, p-type poly(3-hexylthiophene) [ionization potential=4.64] is used as the organic semiconductor material. Thus, the second conductive film is formed using W [work function=4.75] having a work function larger than the ionization potential.

Thereafter, a resist is applied onto the second conductive film, baking is performed thereto, and exposure is performed thereto with the use of a wiring patterning mask to carry out developing. Then, etching of the second conductive film is performed through dry etching. After etching, the resist is peeled off using a peeling solution, whereby a pair of second conductive films, that is, a source electrode 704a and a drain electrode 704b are formed.

Subsequently, application of a resist is further performed, baking is performed thereto, and exposure is performed thereto with the use of a contact mask to carry out developing. Then, etching of the gate insulating film 703 is performed through wet etching. After etching, the resist is peeled off using the peeling solution. Through the step, a surface of the gate electrode 702 is exposed. Thus, application of a voltage to the gate electrode is enabled.

Then, application of photosensitive acrylic is performed, and exposure is performed thereto with the use of a mask for forming a bank to carry out developing. Then, baking is performed to form a bank 705 having an opening portion on the gate electrode. The opening portion is formed to have a hem with a tapered angle of 45 to 60 degrees, and is formed such that an end surface thereof has a curved surface with a first radius of curvature at its upper end portion and a curved surface with a second radius of curvature at its lower end portion. Note that materials for the bank may be organic materials such as polyimide, polyamide, polyimideamide and BCB (benzocyclobutene) or inorganic materials, which include silicon, such as silicon oxide, silicon nitride, silicon oxynitride and a lamination film of the above substances. Further, it is preferable that the opening portion is formed through dry etching in the case of using the inorganic material.

Thereafter, injection of a solution is performed by any of the injection methods described in Embodiment Modes 1 to 4, thereby forming an organic semiconductor film 706.

Note that the source electrode, drain electrode, and gate electrode and respective wirings may be connected through contact between the element substrate and the TFT. That is, the gate electrode is connected to a scanning line through contact for taking the gate electrode out. Further, the wiring layer and the insulating film may be sequentially laminated in order to secure the layer for forming the wiring.

The organic TFT thus formed enables the formation of the organic semiconductor film with efficiency, and thus, material costs can be reduced. Further, according to the present invention, the organic semiconductor film can be formed at the specific spot, and thus, apparatus maintenance and cost of a cleaning solution can be eliminated.

Embodiment Mode 6

In this embodiment mode, description will be made of an example of manufacturing of an organic TFT which, after the formation of a bank, a source electrode and a drain electrode are formed, differently from Embodiment Mode 5, with reference to FIGS. 8A and 8B.

First, a gate electrode 802 is formed on an insulating substrate 801 as in Embodiment Mode 4. At this time, the gate electrode may be held in common by plural TFTs. Further, although not shown in the figure, an insulating film may be provided between the insulating substrate 801 and the gate electrode 802. The insulating firm serves as a barrier layer against water vapor or organic gas which enters from an external environment, and can prevent an organic semiconductor material or the like from deteriorating due to the water vapor or organic gas.

Next, a gate insulating film 803 is formed on the gate electrode 802. Then, a photosensitive acrylic material is applied onto the gate insulating film 803, baking is performed thereto, and exposure is performed thereto with the use of a mask for forming a bank to carry out developing. Thereafter, cleaning with flowing water and baking are sequentially performed thereto to form a bank 804 having an opening portion. Note that materials for the bank may include organic materials such as polyimide, polyamide, polyimideamide, and BCB (benzocyclobutene) and inorganic materials, which include silicon, such as silicon oxide, silicon nitride, silicon oxynitride, and a lamination film of the above substances. Further, it is preferable that the opening portion be formed through dry etching in the case of using the inorganic material.

Next, a second conductive film with a thickness of 200 nm is formed on the bank 804 by sputtering. The second conductive film formed here needs to be connected with an organic semiconductor film through an ohmic contact. Therefore, in the case of a p-type organic semiconductor material, the second conductive film needs to be formed by using a conductive film material (metal material) having a work function larger than an ionization potential of the organic semiconductor material. On the contrary, in the case of an n-type organic semiconductor material, the second conductive film needs to be formed by using a conducive film material (metal material) having a work function smaller than an ionization potential of the organic semiconductor material. In this embodiment mode, p-type poly(3-hexylthiophene) is used as the organic semiconductor material. Thus, the second conductive film is formed using ITO having a large work function.

Thereafter, a resist is applied onto the ITO, baking is performed thereto, and exposure is performed thereto with the use of a wiring patterning mask to carry out developing. Then, cleaning with flowing water is performed thereto, and etching of the ITO is performed through wet etching. After etching, the resist is peeled off using a peeling solution, whereby a source electrode 805a and a drain electrode 805b are formed.

Subsequently, application of a resist is further performed, baking is performed thereto, and exposure is performed thereto with the use of a contact mask to carry out developing. Then, etching of the gate insulating film 803 is performed through wet etching. After etching, the resist is peeled off using the peeling solution. Through the step, a surface of the gate electrode 802 is exposed. Thus, application of a voltage to the gate electrode is enabled.

Thereafter, injection of a solution is performed by any of the injection methods described in Embodiment Modes 1 to 4, thereby forming an organic semiconductor film 806.

Note that, as described with reference to FIGS. 14A and 14B, a source electrode, a drain electrode, and a gate electrode and respective wirings may be connected through contact between the element substrate and the TFT, thereby forming a semiconductor element. Further, a bank and a source or a drain electrode are in inverse top-and-bottom relation to each other in comparison between the structures in FIGS. 14A and 14B and the structures in FIGS. 8A and 8B. Thus, a contact area between a drain electrode and an electrode (pixel electrode, anode, or cathode) can be widely secured.

Thereafter, a liquid crystal material or a light emitting layer may be appropriately provided, thereby completing a liquid crystal display device (liquid crystal display module) or an EL display device (EL display module).

In the organic TFT formed as described above, the organic semiconductor film can be formed with efficiency, and thus, material costs can be reduced. Further, according to the present invention, the organic semiconductor film can be formed at the specific spot, and thus, apparatus maintenance and cost of a cleaning solution can be eliminated.

Further, in the structure of this embodiment mode, the contact area between the source electrode and the drain electrode and the organic semiconductor film is wide, which leads to reduction of contact failure. Moreover, the source electrode and the drain electrode are provided while covering the bank, and thus, a large margin of the region where the bank is formed can be secured.

Embodiment Mode 7

This embodiment mode describes a method of manufacturing the organic TFT that is formed using organic materials with reference to FIG. 9.

Figure 9A:
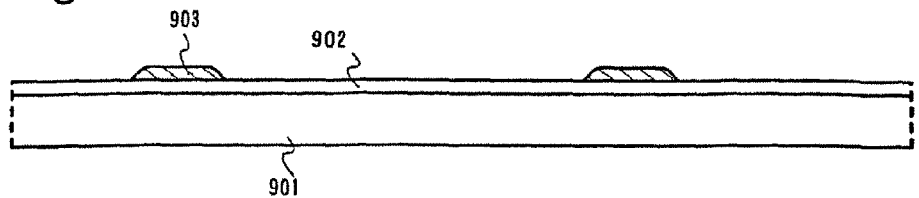
FIGS. 9A, 9B, 9C, 9D, 9E and 9F are diagrams showing a method of manufacturing an organic thin film transistor according to the present invention.

As illustrated in FIG. 9A, a substrate 901 having an insulating surface is prepared. This substrate may be any substrate as long as it is flexible and it is light-transmissive, such as polyethylene terephthalate (PET), polyethylene naphthalate (PEN), polyether sulfone (PES), polycarbonate (PC), polyether imide. In this embodiment mode, plastic substrate is used. The thickness of the substrate 901 is practically 10 to 200 μm.

Then a barrier layer 902 is formed on a substrate 901. It is desired that the barrier layer 902 is made of $AlO_{(x)}N_{(1-x)}$ (where x=0.01 to 20 atomic %), a silicon nitride without containing hydrogen formed by RF sputtering or other insulating materials. The insulating material serves as a barrier layer against the water vapor or organic gas that enters from an external environment and can prevent the organic semiconductor material and the like from deteriorating by the water vapor or organic gas.

A first conductive film which functions as a gate electrode 903 of the TFT is formed on the barrier layer 902 by using a conductive paste, or a PEDOT (polythiophene). As the conductive paste, a conductive carbon paste, a conductive silver paste, a conductive copper paste, a conductive nickel paste, or the like is used. The first conductive film is formed into a predetermined pattern by screen-printing, roll-coating, or ink jetting. The first conductive layer is formed into a predetermined pattern using the conductive paste, and, subjected to leveling, then, drying and curing at 100 to 200° C.

Figure 9B:
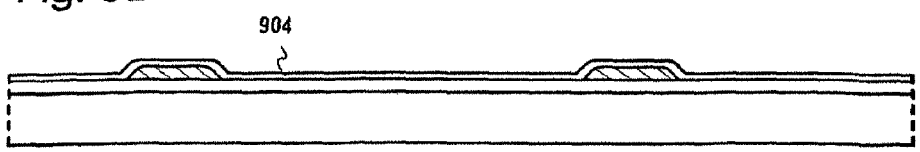

As shown in FIG. 9B, a first insulating film which functions as a gate insulating film 904 is formed on the gate electrode 903. The first insulating film is formed using an acrylic resin, a polyimide resin, a polyamide resin, a phenoxy resin, a nonaromatic polyfunctional isocyanate, or a melamine resin by roll-coating, spraying, ink jetting, spin coating and screen printing. Considering the gate voltage, it is preferable that the film thickness of the gate insulating film is about 100 to 200 nm.

Figure 9C:
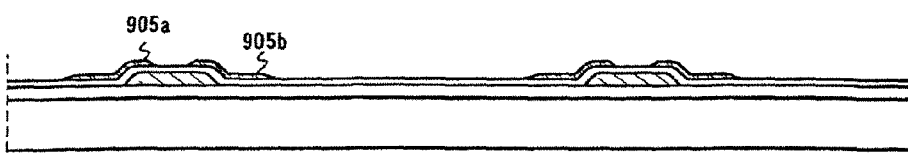

Then, as illustrated, in FIG. 9C, the second conductive film that functions as a source electrode 905*a* or a drain electrode 905*b* is formed on the gate insulating film 904. As a material for the second conductive film, it is desired to use a metal having a large work function for being an ohmic contact with the semiconductor layers, since many organic semiconductor materials for transporting the electric charge are p-type semiconductors that transport positive holes as carriers. Concretely, the second conductive film is formed using a conductive paste including a metal such as gold, platinum, chrome, palladium, aluminum, indium, molybdenum or nickel, or an alloy thereof by printing or roll coating.

Figure 9D:
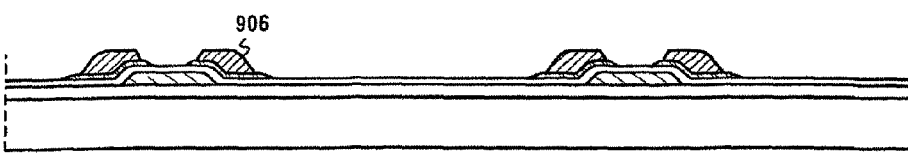

Subsequently, as shown in FIG. 9D, the second insulating film provided as a bank 906 is formed on the source electrode 905*a* or the drain electrode 905*b*. Still, the second insulating film is formed using acrylic resin, polyimide resin, polyamide resin, phenoxy resin, nonaromatic polyfunctional isocyanate, and melamine resin by roll-coating, spraying, ink jetting, spin coating, and screen printing for forming an opening portion on the top of the gate electrode to fill the organic semiconductor film therein. In this embodiment mode, a source electrode or a drain electrode can be formed after forming a bank as described in Embodiment mode 5.

Figure 9E:
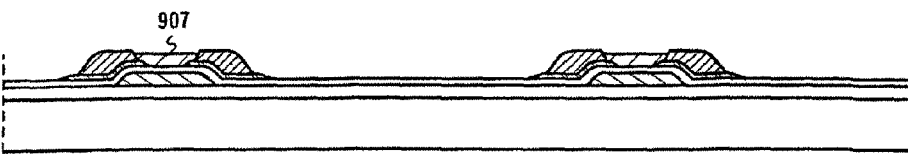

According to any injection method explained in Embodiment Mode 1 to 4, a solution is injected. In case the substrate is large or the first substrate and the second substrate are flexible, it is preferable that organic materials are injected by dropping the solution as described in Embodiment Mode 2. Then as shown in FIG. 9E, the solution is evaporated through natural seasoning or baking to form an organic semiconductor film 907.

Figure 9F:
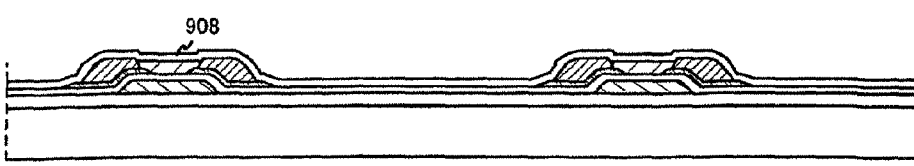

A passivation film 908 is formed as shown in FIG. 9F. The passivation film is formed by an insulating film including silicon such as silicon nitride film or silicon oxynitride film.

Next, as explained in FIG. 14, the source electrode, the drain electrode or the gate electrode and each wiring take contact with and connect to the element substrate and the TFT to form a semiconductor device. Furthermore a liquid crystal material and a light emitting layer are properly formed to make the liquid crystal device (liquid display module) or EL display device (EL display module) completed. Farther, when an insulating film including nitrogen is formed on the first and the second insulating film according to the present invention, the insulating film can prevent an organic semiconductor material or the like from deteriorating due to the water vapor or organic gas.

According to the organic TFT that is formed all of the elements with organic compound materials, light and flexible semiconductor device (specifically, liquid display device, EL display device or other display device) can be obtained. Also, the cost of a semiconductor device can be reduced due to inexpensive materials and a few wasted materials.

An organic TFT according to this embodiment mode can be adapted to the system on panel integrating a pixel portion that displays information in a panel in visual, a communication facility that receives and sends information and a computer function that records or process information.

Embodiment Mode 8

In this embodiment mode, description will be made of an example in which an organic TFT is used as a TFT in a pixel portion of a semiconductor device with reference to FIGS. 14A and 14B and FIGS. 15A and 15B.

Figure 14A:
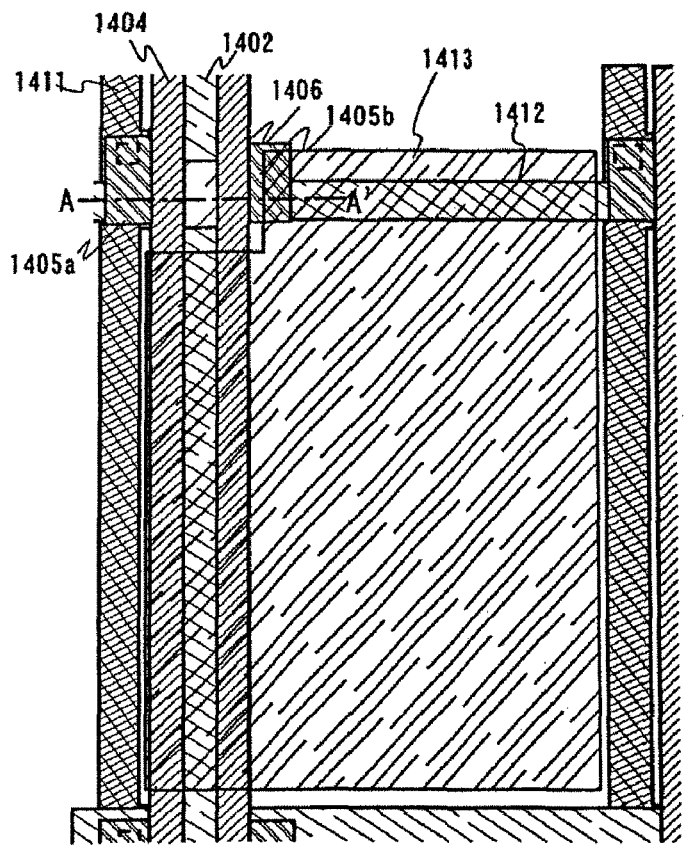
FIGS. 14A and 14B are diagrams showing a method of manufacturing an organic thin film transistor.
Figure 14B:
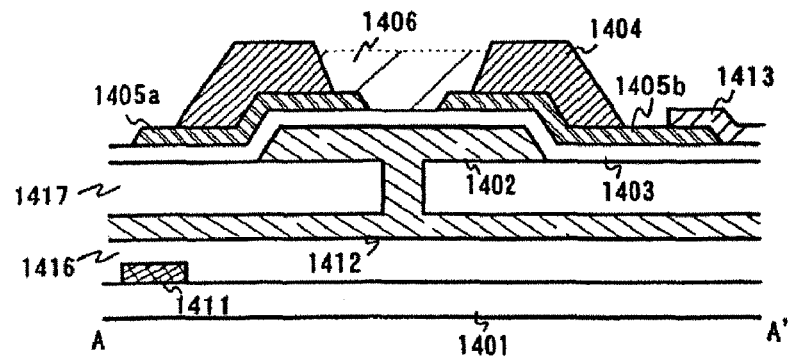

As shown in FIG. 14A, and FIG. 14B which is a sectional view taken along the line A-A' of FIG. 14A, a wiring (signal line) 1411 is formed on an element substrate 1401, and an insulating film 1416 is formed so as to cover the wiring 1411. Then, a gate wiring (scanning line) 1412 is formed so as to intersect the wiring 1411 on the insulating film 1416, and an insulating film 1417 is formed so as to cover the gate wiring. At this time, the insulating films 1416 and 1417 may be formed of a resin material such as polyimide or acrylic to also attain leveling. Alternatively, after an oxide film, a nitride film, or the like is formed of an inorganic material, leveling property may be secured by performing chemical mechanical polishing or mechanical polishing through CMP, ELID, or the like to the formed film.

Next, a gate electrode 1402 is connected to the gate wiring 1412 through a first contact. Thereafter, for example, as shown in FIGS. 7A and 7B, a gate insulating film 1403 is formed, and a source electrode 1405*a* and a drain electrode 1405*b* are formed. Then, the source electrode 1405*a* and the wiring (signal line) 1411 are connected to each other through a second contact.

Subsequently, a bank 1404 is formed on the source electrode 1405*a* and the drain electrode 1405*b*, and an organic material is injected into an aperture of the bank as described in any of Embodiment Modes 1 to 4. After the injection, a solvent is evaporated through drying, whereby an organic semiconductor film 1406 is formed.

Thereafter, an electrode 1413 (corresponding to a pixel electrode in the case of a liquid crystal display device and to an anode (or cathode) in the case of an EL display device) is formed so as to be connected with the drain electrode 1405*b*, as a result of which a semiconductor element is formed. Then, a liquid crystal material or a light emitting layer is appropriately provided; further, an FPC is connected thereto through an anisotropic conductive film; and an external terminal is connected thereto, thereby completing the liquid crystal display device (liquid crystal display module) or the EL display device (EL display module).

Next, description will be made of a pixel portion having a structure, which is different from that in FIGS. 14A and 14B, with reference to FIGS. 15A and 15B.

Figure 15A:
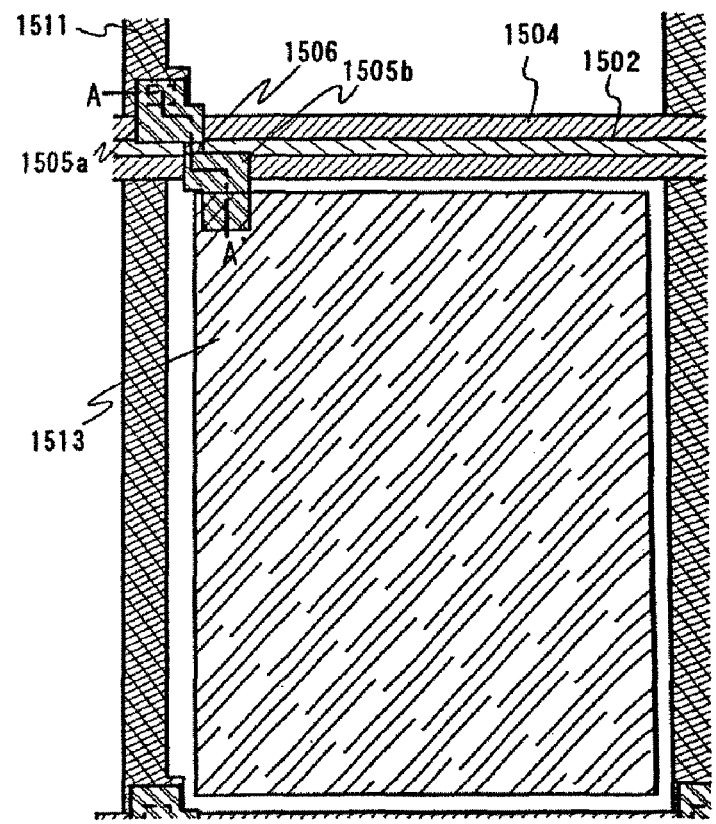
FIGS. 15A and 15B are diagrams showing a method of manufacturing an organic thin film transistor.
Figure 15B:
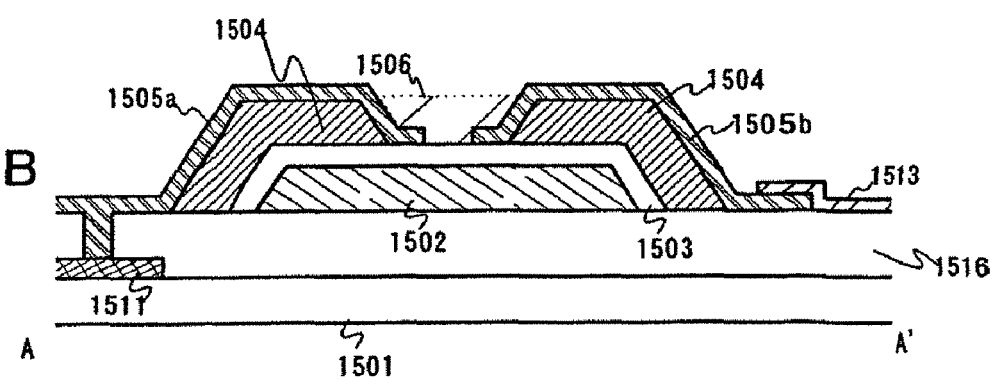

As shown in FIG. 15A, and FIG. 15B which is a sectional view taken along the line A-A' of FIG. 15A, a wiring (signal line) 1511 is formed on an element substrate 1501, and an insulating film 1516 is formed so as to cover the wiring 1511. Then, a conductive film, which is to serve as a gate electrode 1502, is formed so as to intersect the wiring 1511 on the insulating film 1516. At this time, the insulating film 1516 may be formed of a resin material such as polyimide or acrylic to also attain leveling. Alternatively, after an oxide film, a nitride film, or the like is formed of an inorganic material, leveling property may be secured by performing chemical mechanical polishing or mechanical polishing through CMP, ELID, or the like to the formed film.

Figure 8A:
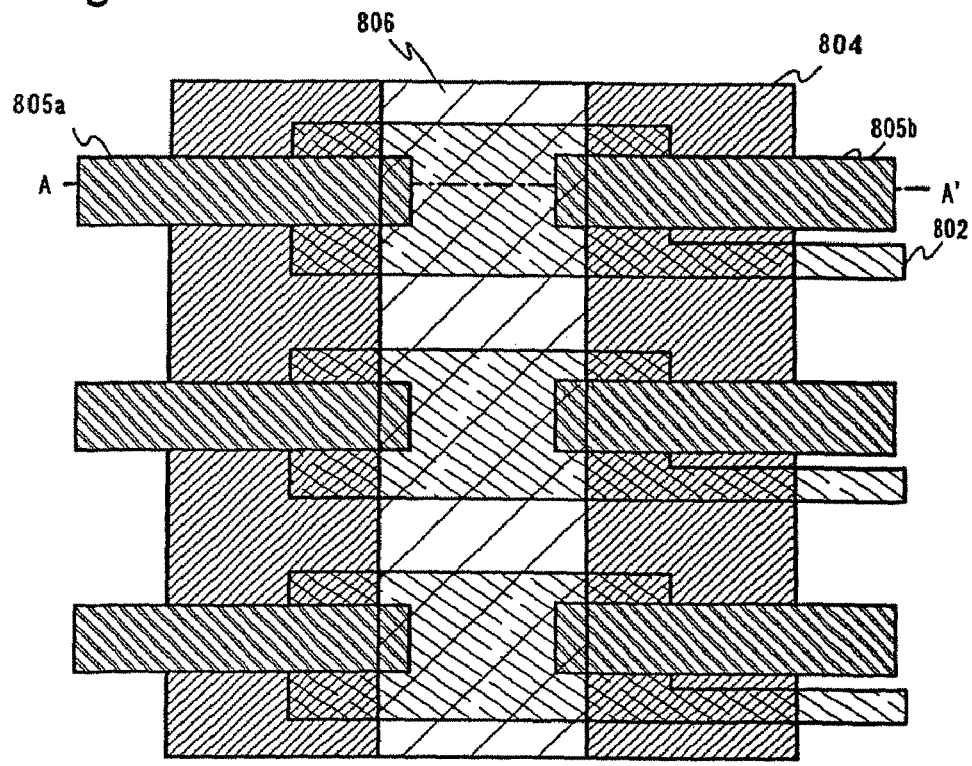
FIGS. 8A, and 8B are diagrams showing a method of manufacturing an organic thin film transistor according to the present invention.
Figure 8B:
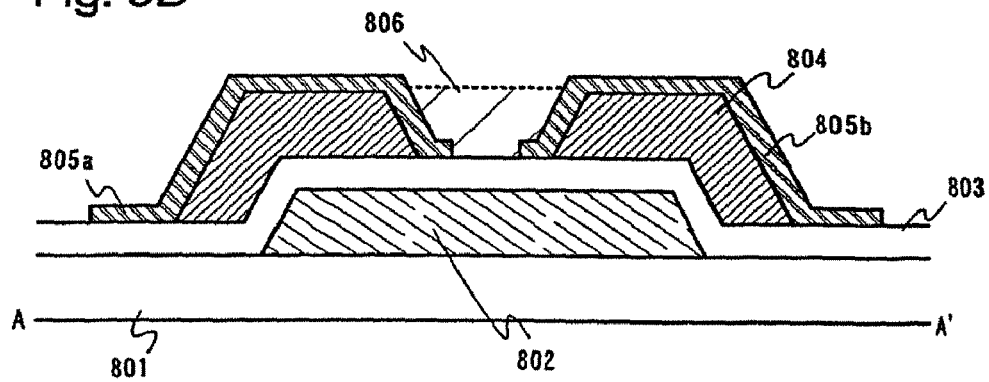

Next, for example, as shown in FIGS. 8A and 8B, a gate insulating film 1503 is formed, and a bank 1504 provided with an opening portion (which corresponds to an aperture in a state in which a second substrate is superimposed on the element substrate) is formed above the gate electrode 1502. Then, a source electrode 1505a and a drain electrode 1505b are formed so as to cover the bank 1504. Then, the source electrode 1505a is connected to the wiring (signal line) 1511 through contact. Thereafter, an organic material is injected into the aperture of the bank 1504 as shown in any of Embodiment Modes 1 to 4. After the injection, a solvent is evaporated through drying, whereby an organic semiconductor film 1506 is formed.

Thereafter, an electrode 1513 (corresponding to a pixel electrode in the case of a liquid crystal display device and to an anode (or cathode) in the case of an EL display device) is formed so as to be connected with the drain electrode 1505b, as a result of which a semiconductor element is formed. Then, a liquid crystal material or a light emitting layer is appropriately provided; further, an FPC is connected thereto through an anisotropic conductive film; and an external terminal is connected thereto, thereby completing the liquid crystal display device (liquid crystal display module) or the EL display device (EL display module).

The structures in FIGS. 15A and 15B do not require a gate wiring. Thus, contact formation for connecting the gate wiring to the gate electrode is not required, and the number of masks can be reduced. Further, in this embodiment mode, the gate electrode can be held in common in each column direction. Therefore, the organic TFT is preferably used in the pixel portion.

Note that the organic TFTs shown in FIGS. 14A and 14B and FIGS. 15A and 15B may be foamed by using any of the methods in Embodiment Modes 5 to 7. In particular, the organic TFT is formed by using the method in Embodiment Mode 7, whereby the liquid crystal display device or EL display device, which is light in weight and has high flexibility, can be formed. Further, although the organic TFT of the present invention is used in the pixel portion in FIGS. 14A and 14B and FIGS. 15A and 15B, the organic TFT excellent in TFT characteristics may also be used in a driver circuit portion.

As to the semiconductor device (liquid crystal display device or EL display device) formed as described above, the organic semiconductor film can be formed with efficiency, and thus, material costs can be reduced. Further, according to the present invention, the organic semiconductor film can be formed at the specific spot, and thus, apparatus maintenance and cost of a cleaning solution can be eliminated.

EMBODIMENTS

Embodiment 1

Figure 10:
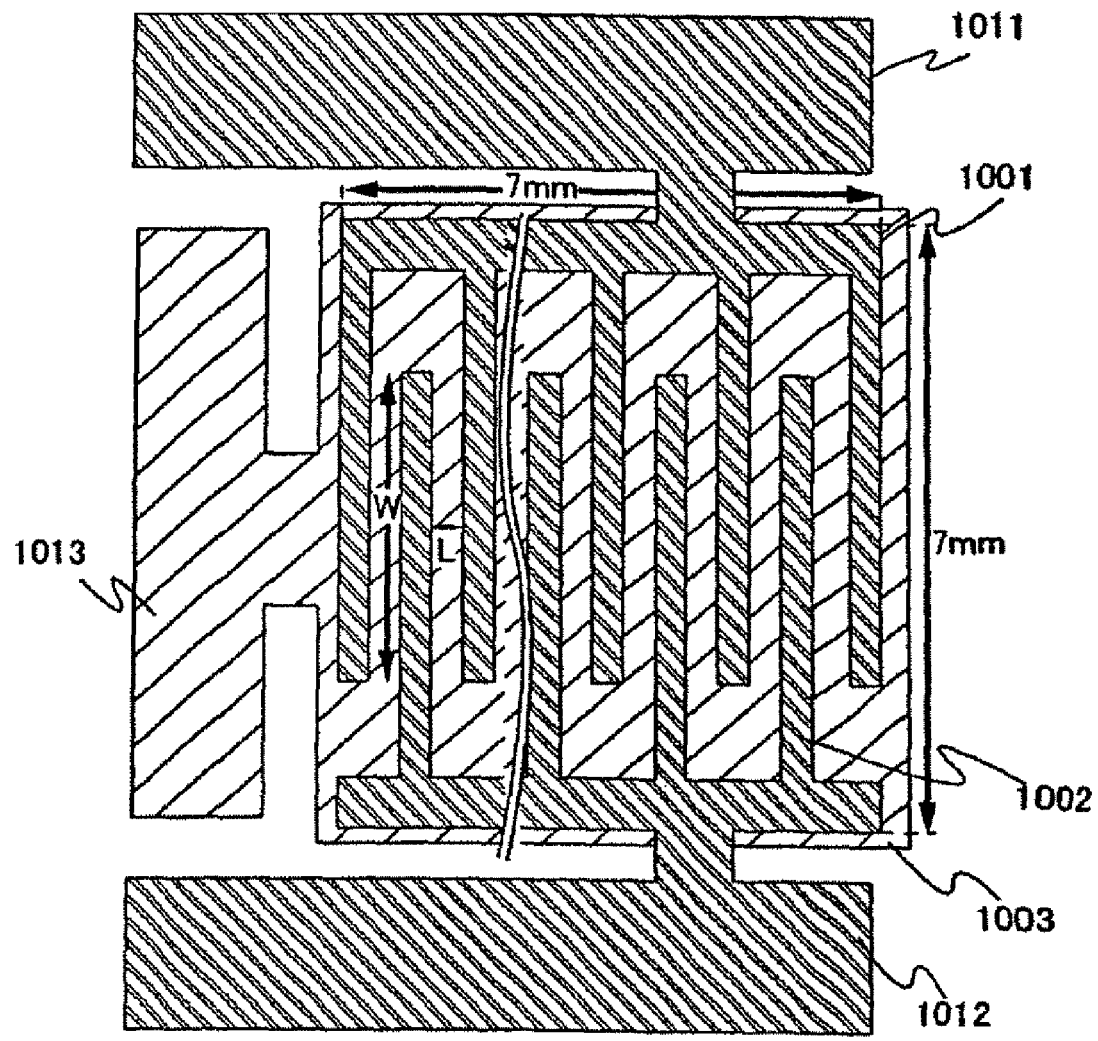
FIG. 10 is a diagram showing an organic thin film transistor according to the present invention, which is used in measurement.

In this embodiment, Vd-Id characteristics and VG-Id characteristics were measured with the use of the organic TFT of the present invention. Note that, as shown in FIG. 10, the organic TFT as a measurement sample has a structure in which, in an atmosphere: a gate electrode 1003 formed of tungsten is provided on a quartz substrate; a gate insulating film is provided on the gate electrode; a source electrode 1001 and a drain electrode 1002 which are formed of tungsten are provided on the gate insulating film so as to intersect each other in a comb form; and an organic semiconductor film is provided between the source electrode and the drain electrode. Then, the source electrode 1001, the drain electrode 1002, and the gate electrode 1003 are respectively provided with measurement pads (source electrode pad 1011, drain electrode pad 1012, and gate electrode pad 1013) for application of a measurement voltage and detection of a current.

Further, a channel length of the organic TFT corresponds to the entire amount of an interval between the source electrode and the drain electrode (which is indicated by L in FIG. 10), and L=3 µm is established. On the other hand, a channel width corresponds to the entire amount of the length of a region where the source electrode overlaps the drain electrode (which is indicated by W in FIG. 10), and W=7840 mm is given because the interval between the source electrode and the drain electrode is set to 3 µm.

Figure 11:
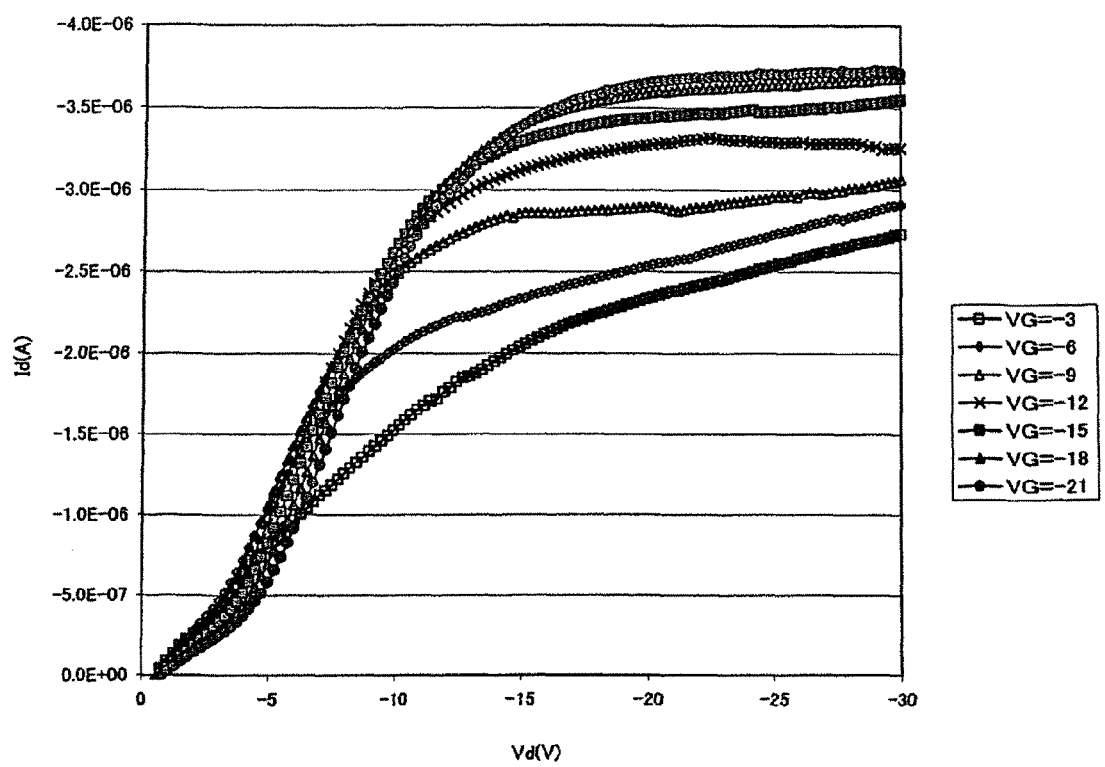
FIG. 11 is a chart showing results of the measurement of the organic thin film transistor according to the present invention.
Figure 12:
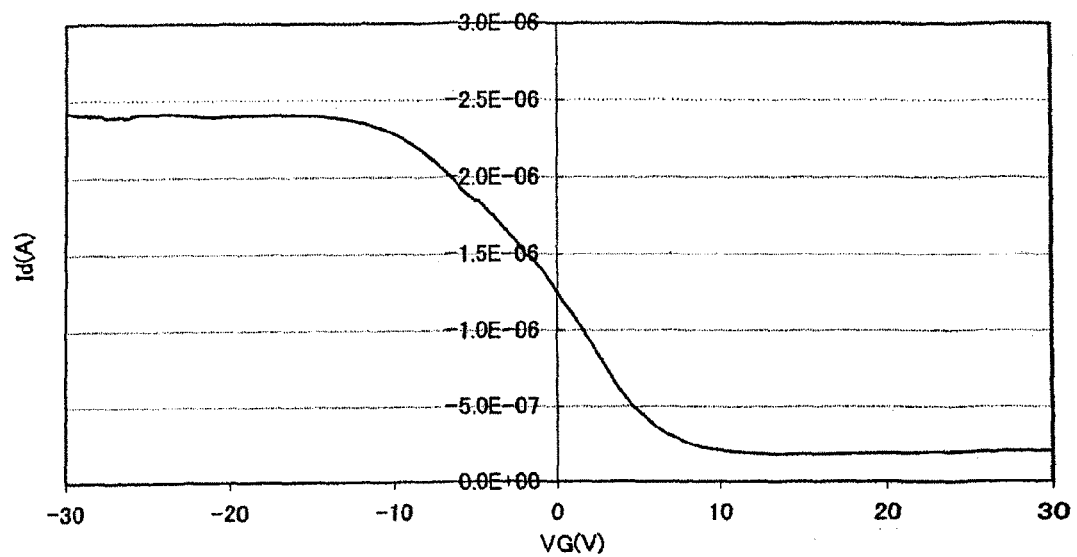
FIG. 12 is a chart showing results of the measurement of the organic thin film transistor according to the present invention.

FIG. 11 shows measurement results in an atmosphere as to Vd-Id characteristics in the case where each of voltages of VG=−3, −6, −9, −12, −15, −18, and −21 V is applied to the organic TFT shown in FIG. 10. Further, FIG. 12 shows results concerning V-I characteristics in measurement in an atmosphere of a current of each of the source electrode, the drain electrode, and the gate electrode and the gate voltage under application of a voltage Vd=−5 V. Moreover, from the results in FIGS. 11 and 12, there are obtained mobility of $3\times10^{-6}$ cm$^2$/V s and an on-off ratio of 14.

The TFT characteristics depend on a thickness of a semiconductor film or a W/L ratio of a channel formation region. However, the semiconductor film can be formed with a thin film thickness according to the present invention. Therefore, the above-described TFT characteristics (mobility and on-off ratio) can be obtained.

By implementing the present invention, thin film thickness of a semiconductor film can be obtained. Sine the organic semiconductor film can be made with efficiency, the material cost can be reduced.

Further, according to the present invention, the organic semiconductor film can be formed only at the specific spot. Thus, apparatus maintenance and costs of cleaning solution and material can be eliminated, and therefore, total cost can be reduced. As a result, a low-cost semiconductor device provided with an organic TFT can be provided. Further, according to the present invention, there can be provided a method of manufacturing an organic semiconductor film, with which materials to be wasted and, discarded are eliminated, with which liquid wastes along with apparatus maintenance and cleaning are not produced, and which is friendly to the environment.

What is claimed is:
1. A thin film transistor comprising:
 a first conductive film provided over a substrate;
 a first insulating film provided over the first conductive film;
 a pair of second conductive films provided over the first insulating film;
 a second insulating film which is provided over the pair of second conductive films, wherein the second insulating film includes an opening portion to expose part of the pair of second conductive films; and
 a semiconductor film comprising an organic material provided over the pair of second conductive films and in contact with side surfaces of the second insulating film, wherein the semiconductor film is in contact with the first insulating film.
2. The thin film transistor according to claim 1, wherein the opening portion is provided above the first conductive film.
3. The thin film transistor according to claim 1, wherein the first conductive film or the second conductive film is formed of a conductive paste.

4. The thin film transistor according to claim 1, wherein the first conductive film functions as a gate electrode.

5. The thin film transistor according to claim 1, wherein the pair of second conductive films functions as a source electrode and a drain electrode.

6. The thin film transistor according to claim 1, wherein the first insulating film functions as a gate insulating film.

7. The thin film transistor according to claim 1, wherein the second insulating film is formed of acrylic, polyimide, silicon oxynitride, or silicon nitride.

8. The thin film transistor according to claim 1, wherein the substrate is a glass substrate, a plastic substrate, or a quartz substrate.

9. The thin film transistor according to claim 1, wherein the first conductive film comprises a material selected from the group consisting of Ta, W, Ti, Mo, Al, and Cu or an alloy material or compound material containing the element as its main constituent.

10. The thin film transistor according to claim 1, wherein the first insulating film comprises a material selected from the group consisting of silicon oxide, silicon oxynitride, and other silicon.

11. The thin film transistor according to claim 1, wherein the second insulating film comprises a material selected from the group consisting of polyimide, polyamide, polyimide amide and BIB (benzocyclobutene) or inorganic materials, which include silicon, such as silicon oxide, silicon nitride, silicon oxynitride and a lamination film of the above substances.

12. The thin film transistor according to claim 1, wherein the organic material comprises a material selected from the group consisting of polycyclic aromatic compounds, conjugated double bond compounds, carotene, macro ring compounds, and complexes thereof, phthalocyanine, electronic transfer type complexes, and tetrathiofulvalenes: TCNQ complexes, free radicals, diphenylpicrylhydrazyl, pigments, proteins, π-conjugated polymers, CT complexes, polyvinylpyridine, iodine and phthalocyanine metal complexes, polyacetylene, polyaniline, polypyrrole, polythienylene, polythiophene derivatives, poly(3-hexylthiophene) [P3HT; a polymer where the alkyl group of a polythiophene derivative with a flexible alkyl group introduced into a third position of polythiophene is a hexyl group], poly(3-alkylthiophene), poly(3-docoslthiophene), polyparaphenylene derivatives or polyparaphenylenevinylene derivatives.

* * * * *